United States Patent [19]
Toyoda et al.

[11] Patent Number: 5,378,658
[45] Date of Patent: Jan. 3, 1995

[54] PATTERNING PROCESS INCLUDING SIMULTANEOUS DEPOSITION AND ION MILLING

[75] Inventors: Osamu Toyoda; Keiichi Betsui, both of Kawasaki, Japan

[73] Assignee: Fujitsu Limited, Kawasaki, Japan

[21] Appl. No.: 951,801

[22] Filed: Sep. 28, 1992

[30] Foreign Application Priority Data

Oct. 1, 1991 [JP] Japan ................. 3-253956

[51] Int. Cl.⁶ ............................. H01L 21/31
[52] U.S. Cl. ........................ 437/228; 427/78; 437/984
[58] Field of Search .............. 313/309, 310; 437/228, 437/984; 427/77, 78

[56] References Cited

U.S. PATENT DOCUMENTS

| | | | |
|---|---|---|---|
| 3,921,022 | 11/1975 | Levine | 313/309 |
| 4,253,221 | 3/1981 | Cochran, Jr. et al. | 29/25.18 |
| 4,513,308 | 4/1985 | Greene et al. | 357/55 |
| 4,874,493 | 10/1989 | Pan | 204/192.11 |

OTHER PUBLICATIONS

Ghandhi, S., *VLSI Fabrication Principles*, John Wiley & Sons, 1983, p. 527.
K. Betsui, "Fabrication and Characteristics of Si Field Emitter Arrays", Technical Digest of IVMC 91, Nagahama 1991, pp. 26–29.
Patent Abstracts of Japan, vol. 12, No. 9 (E-572) Jan. 12, 1988 & JP-A-62 171143 (Sumitomo Electric Ind. Ltd.) Jul. 28, 1987.

*Primary Examiner*—George Fourson
*Attorney, Agent, or Firm*—Staas & Halsey

[57] ABSTRACT

A process for forming a pattern on a substrate which includes depositing a film-forming material from above a mask formed on the substrate and forming a film on the mask and in regions of the substrate not covered by the mask, wherein the film formation is carried out while irradiating an ion beam towards the mask so that the deposition on the side surface portion of a deposition material being deposited on the mask is inhibited by ion milling. An electronic device such as a micro field emission cathode or a multi-layer circuit structure is effectively formed using the process.

5 Claims, 12 Drawing Sheets

Fig. 12 (1)
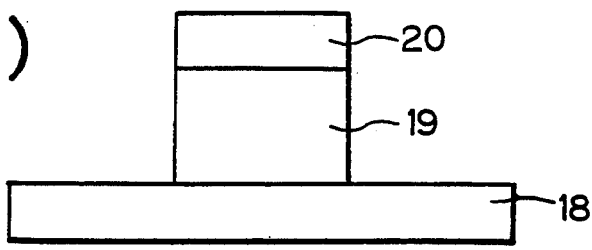
Fig. 12 (2)
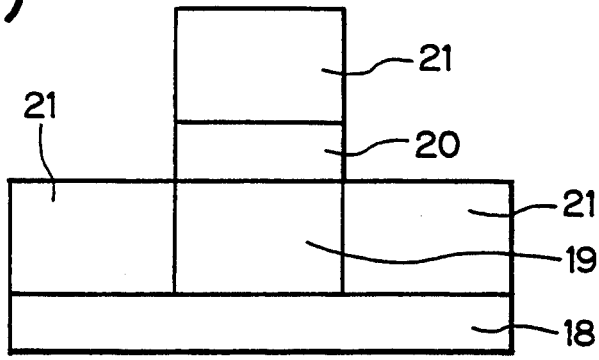
Fig. 12 (3)
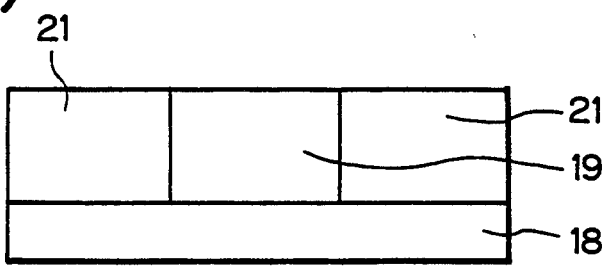
Fig. 12 (4)
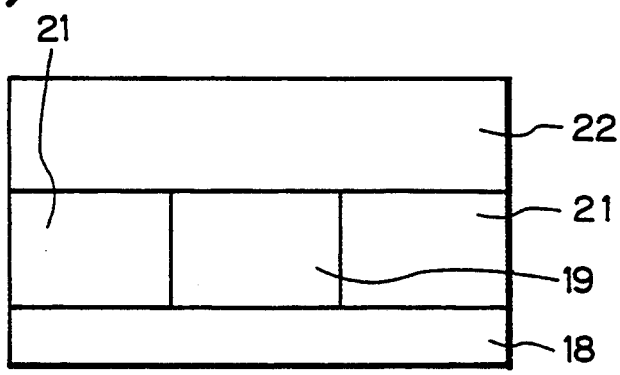

5,378,658

PATTERNING PROCESS INCLUDING SIMULTANEOUS DEPOSITION AND ION MILLING

BACKGROUND OF THE INVENTION

1. Field of the Invention

This invention relates to a patterning process using a mask such as for example the process used when an insulating film of a micro field emission cathode is formed.

2. Description of the Related Art

When a film-forming material is deposited from above a mask by vacuum deposition, etc, and a film is formed in regions other than the mask, the deposited material on the mask gradually expands and the mask region expands substantially and gradually. Therefore, there occurs the problem that the edge of the pattern formed as a film becomes a slope, and this problem impedes the film formation of an insulating film of a micro field emission cathode, or the like.

FIG. 4 is a sectional view of a micro cold cathode used for a micro vacuum tube, or the like. A conical tip having a pointed tip (emitter tip) 2 is formed on a Si substrate 1, and an electron extraction gate electrode 4 is formed on an insulating layer 3 so formed as to encompass the emitter tip 2. When a voltage is applied between the emitter tip 2 and the gate electrode 4, a high voltage is applied to the cone tip of the emitter tip 2 and field emission occurs. The micro vacuum tube provides greater mobility of the electron than semiconductor devices, can operate at a high speed, and is highly resistant to high temperatures and radiation damage. Owing to these characteristic features of the micro vacuum tube, its application to microwave devices, ultra-high speed computation devices, radiation-resistant devices (in the universe, reactors, etc), high temperature environment devices, display devices, etc, is expected.

FIG. 5 is a sectional view showing a step-wise production process of a micro cold cathode. First of all, the surface of a Si substrate 1 is thermally oxidized in step (1). In the next step (2), the thermal oxide film 5 is patterned into a round shape to form a mask of the oxide film 5m. The Si substrate 1 is then etched in the third step (3). At this time, under-etching is carried out so that side etching is made as shown in the drawing.

The surface of the Si substrate is again oxidized thermally in the fourth step (4), and an emitter tip 2 having a pointed tip is formed inside the oxide film 6. In this state, an insulator such as silicon dioxide ($SiO_2$), etc, is vacuum deposited in the fifth step (5), and an insulating layer 3 is so formed as to encompass the emitter tip 2. Subsequently, a metal is vacuum deposited and thus a gate electrode 4 is formed on the insulating layer 3.

In the subsequent sixth step (6), only the oxide film 6 is etched by a hydrofluoric acid, or the like, so as to lift off the mask 5m and to form a gate window 7. Finally, the gate electrode 4 is patterned and the cathode is completed.

In this case, no problem occurs if the inner wall 8 of the gate window 7 is formed vertically and with fidelity to the mask 5m as shown in FIGS. 4 and 5 but in practice, the inner wall 8 becomes a slope 8s having a conical shape as shown in FIG. 6, and the window expands gradually into a large diameter D. FIG. 7 is a sectional view showing, in enlargement, the conventional vacuum deposition step (5) in FIG. 5.

At the point of film thickness $t_1$ at the start of vacuum deposition, the insulating layer 3 is formed with relatively high fidelity to the outer shape of the mask 5m. The vacuum deposition material 10 deposited on the mask 5m has substantially the same size as that of the starting mask 5m at the point of film thickness $t_1$ but when the film thickness becomes gradually greater to $t_1$, $t_2$, $t_3$ and so forth, the edge of the vacuum deposition material 10 on the mask 5m gradually swells outward from the mask 5m.

In other words, the first particles 10a of the vacuum deposition material are deposited while swelling slightly outward from the outer periphery of the mask 5m and the next particles 10a are likely deposited while swelling slightly outward from the previous particles. In this way, the vacuum deposition material 10 is sequentially deposited while swelling outward bit by bit.

In other words, even when a setting is made in such a manner that the deposition material is incident perpendicularly to the substrate 1, the deposition material 10 deposited on the mask 5m gradually swells outwardly, so that the outer diameter of the mask 5m substantially expands and the shade of the mask 5m increases. Therefore, the opening of the gate window 7 becomes greater with an increase in the film thickness, and the insulating layer 3 becomes conical.

As described above, the inner wall 8s of the gate window 7 is inclined and defines a cone greater than the outer diameter d of the mask 5m. Therefore, the gap between the gate electrode 4 and the tip of the emitter tip 2 becomes greater than $\frac{1}{2} \cdot D$. As a result, when a voltage is applied between the emitter tip 2 and the gate electrode 4, the field concentration at the emitter 2 drops as is also obvious from a drop of the density of the isoelectric line 9, and this creates a problem when the voltage of field emission is reduced.

When the inner wall 8 of the gate window 7 is vertical as shown in FIG. 4, the diameter d of the gate window 7 becomes small, and the gap between the gate electrode 4 and the tip of the emitter tip 2 becomes small, i.e. $\frac{1}{2} \cdot d$. As a result, the density of the isoelectric line 9 becomes high and effective field concentration occurs on the emitter tip 2.

Therefore, when the insulating layer 3 is formed, the inner wall 8 of the gate window 7 must be kept perpendicular with fidelity to the outer shape of the mask 5m. Such a requirement also occurs during patterning using an ordinary mask. This is not a serious problem when the film thickness is small, but as the film thickness increases, the problem owing to an inclination below the edge of the mask becomes more significant.

SUMMARY OF THE INVENTION

In view of the problems with the prior art described above, the present invention aims at suppressing the occurrence of the inclination below the outer periphery of a mask when patterning is effected using the mask, and forming a pattern profile that is approximate to the perpendicular.

FIG. 1 is a sectional view useful for explaining the fundamental principle of the patterning process according to the present invention. In the process of the present invention, when a film-forming material is deposited onto a substrate from above a mask m and a film is formed in regions other than the mask m for pattern formation, an ion beam IB is irradiated towards the mask m and film formation is effected while the deposition on the side surface portion of a deposition material being deposited on the mask m is inhibited by ion milling.

BRIEF DESCRIPTION OF THE DRAWINGS

FIGS. 12(1)–(4) are sectional views showing stepwise a process for forming a multi-layer circuit structure according to the present invention.

DESCRIPTION OF THE PREFERRED EMBODIMENTS

Figure 1:
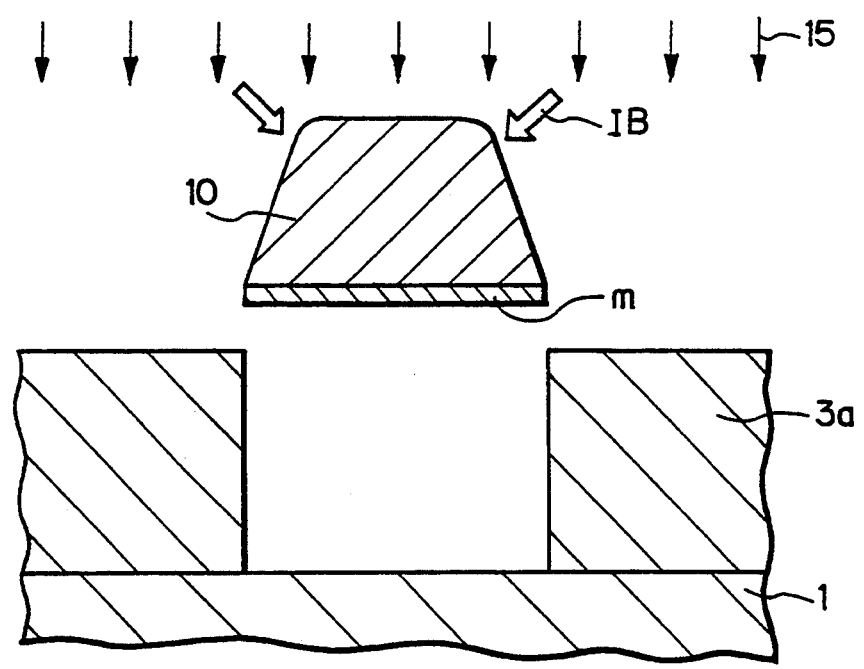
FIG. 1 is a sectional view useful explaining the fundamental principle of a patterning method according to the present invention.

When the film formation is carried out from above the mask m, as shown in FIG. 1, it is effected while the ion beam IB is irradiated to the mask m, and the outer periphery of the deposition material 10 deposited on the mask m is subjected to ion milling. As a result, it becomes possible to prevent the deposition material 10 on the mask m from expanding outward and the shade of the mask from expanding, and the deposition film 3a comes to possess a pattern shape having fidelity to the mask m.

As the ion beam IB for ion-milling the deposition material 10 on the mask m, an argon ion beam is suitable, although the kind of ion beam IB varies with the kind of deposition material 10. In the case where the layer to be formed is an oxide film, it is effective to use an oxygen ion beam and where the layer to be formed is a nitride film, it is effective to use a nitrogen ion beam.

Figure 2:
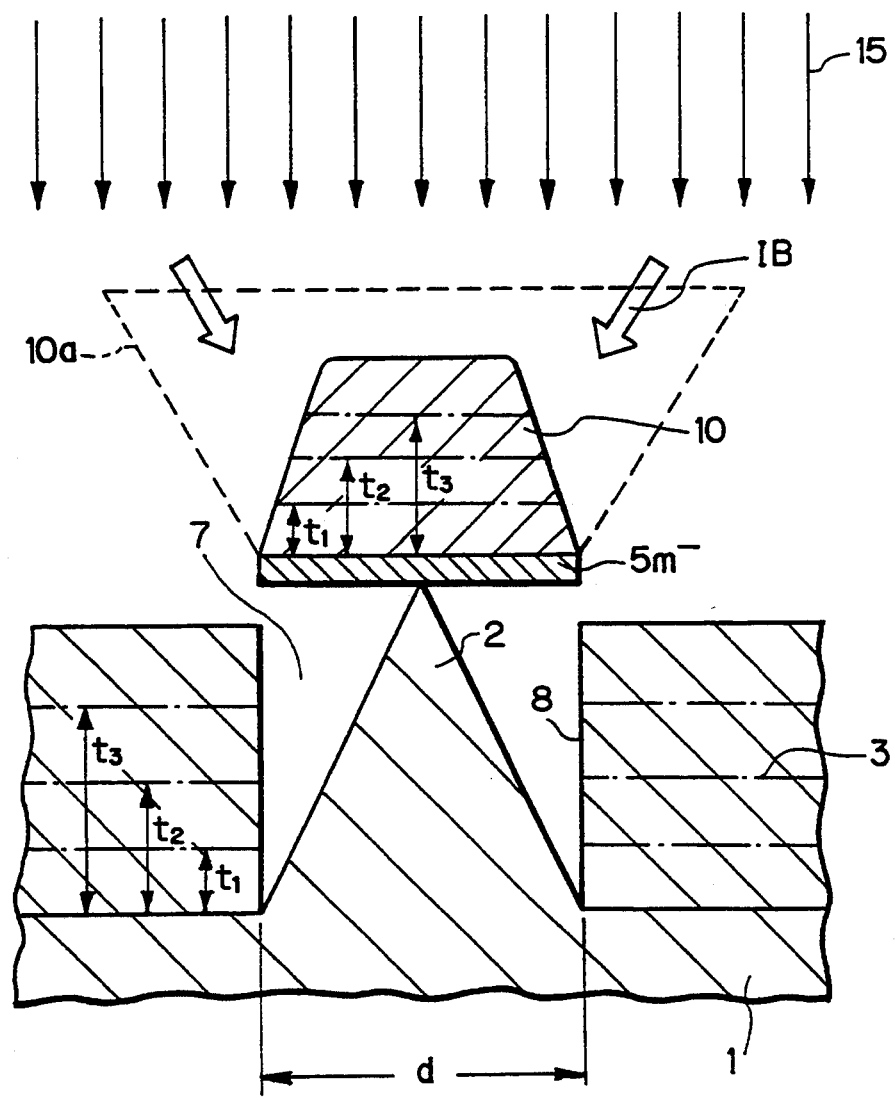
FIG. 2 is a sectional view showing an embodiment where the patterning process of the present invention is applied to the production of a micro cold cathode.
Figure 5:
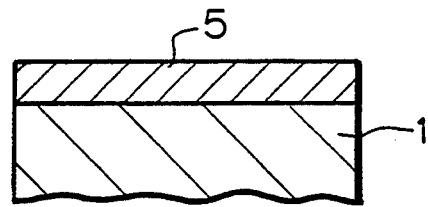
FIGS. 5(1)–(7) are sectional views showing a stepwise process for forming a micro cold cathode.
Figure 5:
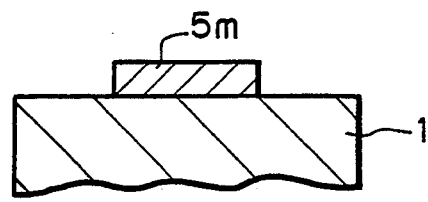
Figure 5:
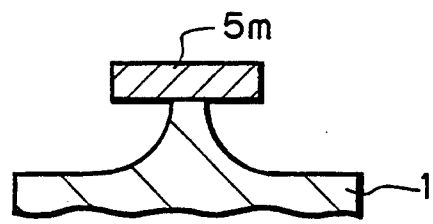
Figure 5:
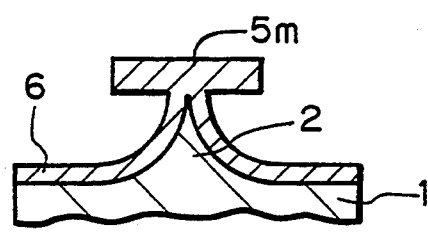
Figure 5:
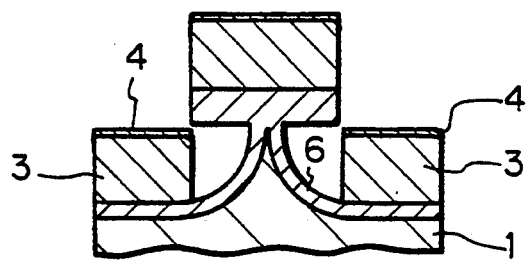
Figure 5:
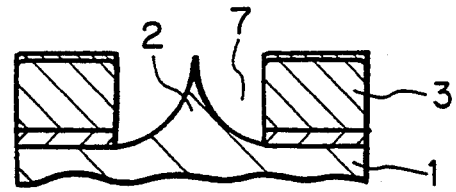
Figure 5:
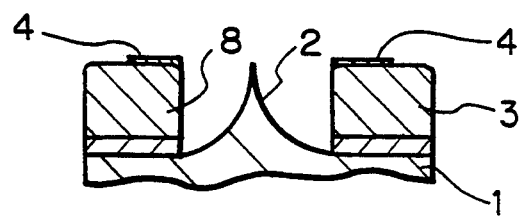
Figure 6:
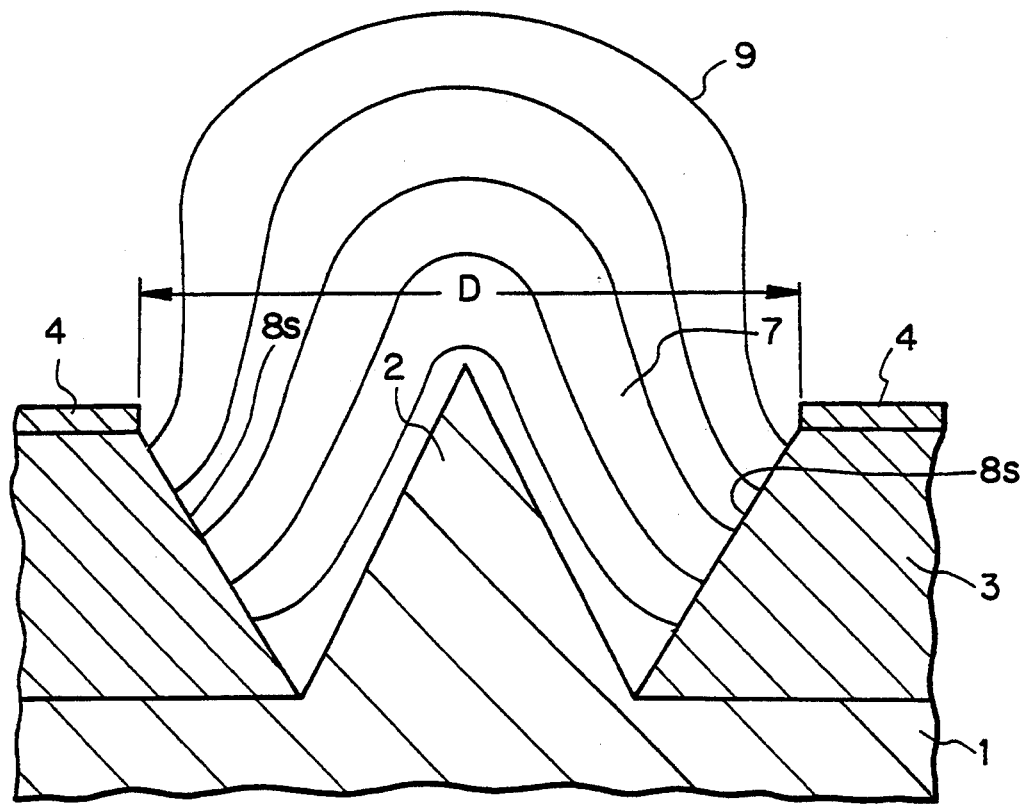
FIG. 6 is a sectional view of a micro cold cathode patterned by a conventional process.

Next, how the patterning process according to the present invention is embodied in practice will be explained below. When silicon dioxide ($SiO_2$) is vacuum deposited from above the mask 5m in the vacuum deposition step (5) shown in FIG. 5 to form the insulating layer 3, vacuum deposition is carried out while the ion beam IB is being irradiated as shown in FIG. 2.

At the point in time when the vacuum deposition material 10 is deposited on the mask 5m to a film thickness $t_1$, it is deposited while swelling out from the mask 5m. However, the edge portion around the outer periphery is milled by the ion beam IB. Since the adhesion strength of the particles of the deposition material is low at the outer peripheral portion from where the deposition material is to swell and on the mask 5m, the deposition material is easily milled by the ion beam IB. Accordingly, though the deposition of the vacuum deposition material proceeds on the mask 5m, the swell portion at the outer peripheral portion does not occur.

Accordingly, whereas the vacuum deposition material having an inverted trapezoidal shape is formed as indicated by a dash line 10a until completion of the vacuum deposition according to the prior art method, the deposition material is deposited in the trapezoidal shape as indicated by a solid line 10 according to the method of the present invention. It is therefore possible to prevent the vacuum deposition material from expanding from the outer periphery of the mask and thereby substantially expand the mask outer shape, and prevent the shade portion of the mask from expanding, as has been observed in the prior art method. As a result, the diameter of the gate window 7 does not increase with an increase in the deposition film thickness, and a gate window 7 that rises perpendicularly to the substrate surface as designed can be obtained. Incidentally, when the film thickness of the insulating layer 3 is 1 μm and the diameter of the mask 5m is 1 μm, the gate diameter d is almost 1 μm, and a gate diameter that is substantially equal to the outer diameter of the mask 5m can be obtained.

Figure 3:
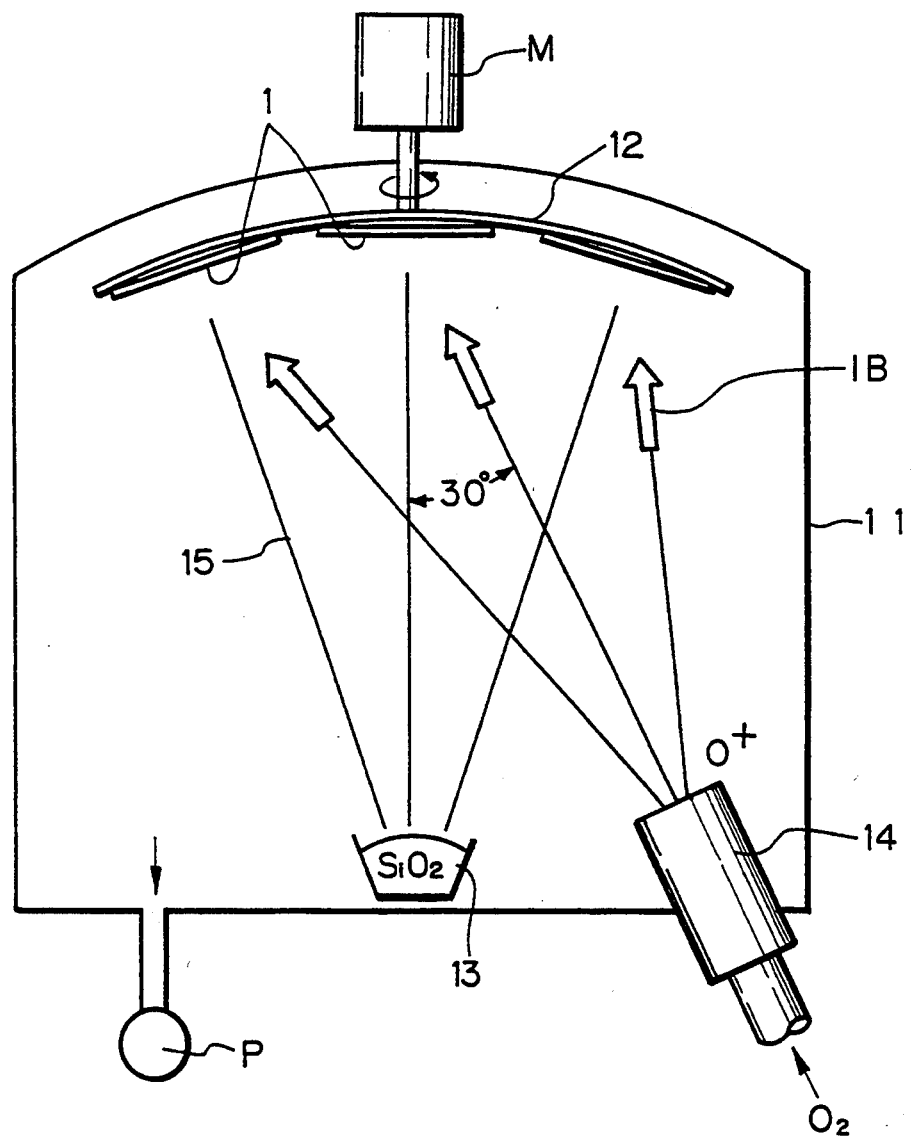
FIG. 3 is a sectional side view showing schematically an apparatus for practicing the patterning process of the present invention.
Figure 4:
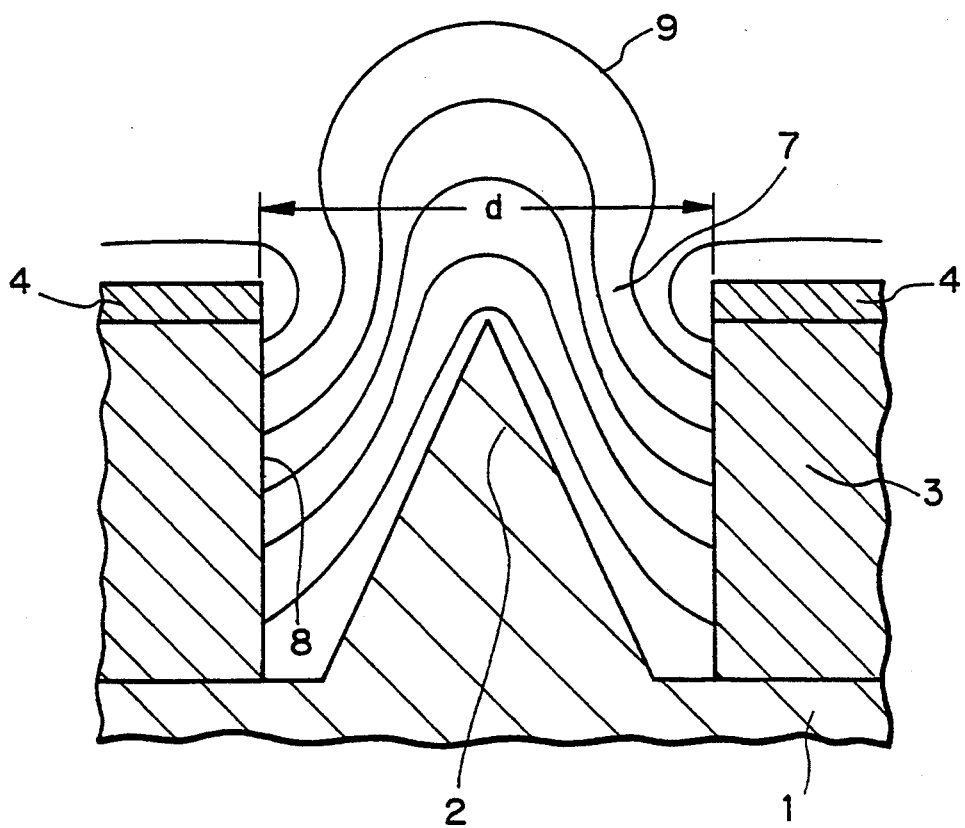
FIG. 4 is a sectional view of a micro cold cathode used for a micro vacuum tube.

FIG. 3 is a side view of an apparatus for practising the method of the present invention. Reference numeral 11 denotes a vacuum vessel. A substrate 1 is held by a substrate holder 12 inside the vacuum vessel 11 and is driven for rotation by an external motor M. An evaporation source 13 and an ion gun 14 are disposed at positions opposing the substrate 1, and vacuum deposition is carried out while the vacuum vessel 11 is being evacuated by a vacuum pump P.

The outer periphery of the deposition material 10 deposited on the mask 5m can be milled efficiently by setting the center line of the ion beam IB generated from the ion gun 14 to an inclination of about 30° with respect to the center line of the deposition particle stream 15 generated from the evaporation source 13 towards the substrate 1, and the removed particles are discharged outside the vacuum vessel 11. The ion beam IB reaches not only the mask 5m but also the insulating layer 3 formed on the substrate 1, and the milling operation is effected. In this case, the particles having incomplete bonds and a low bonding power on the insulating layer 3 are removed by the milling operation, and an insulating layer 3 having a high bonding strength can be obtained.

When an argon ion is used as the ion for milling the outer periphery of the deposition material 10 on the mask, it is effective for a variety of kinds of materials to be deposited. Where the material is an oxide film, an oxygen ion is suitable as the ion for milling, and a nitrogen ion is suitable in the case of the nitride film ($Si_3N_4$).

Figure 7:
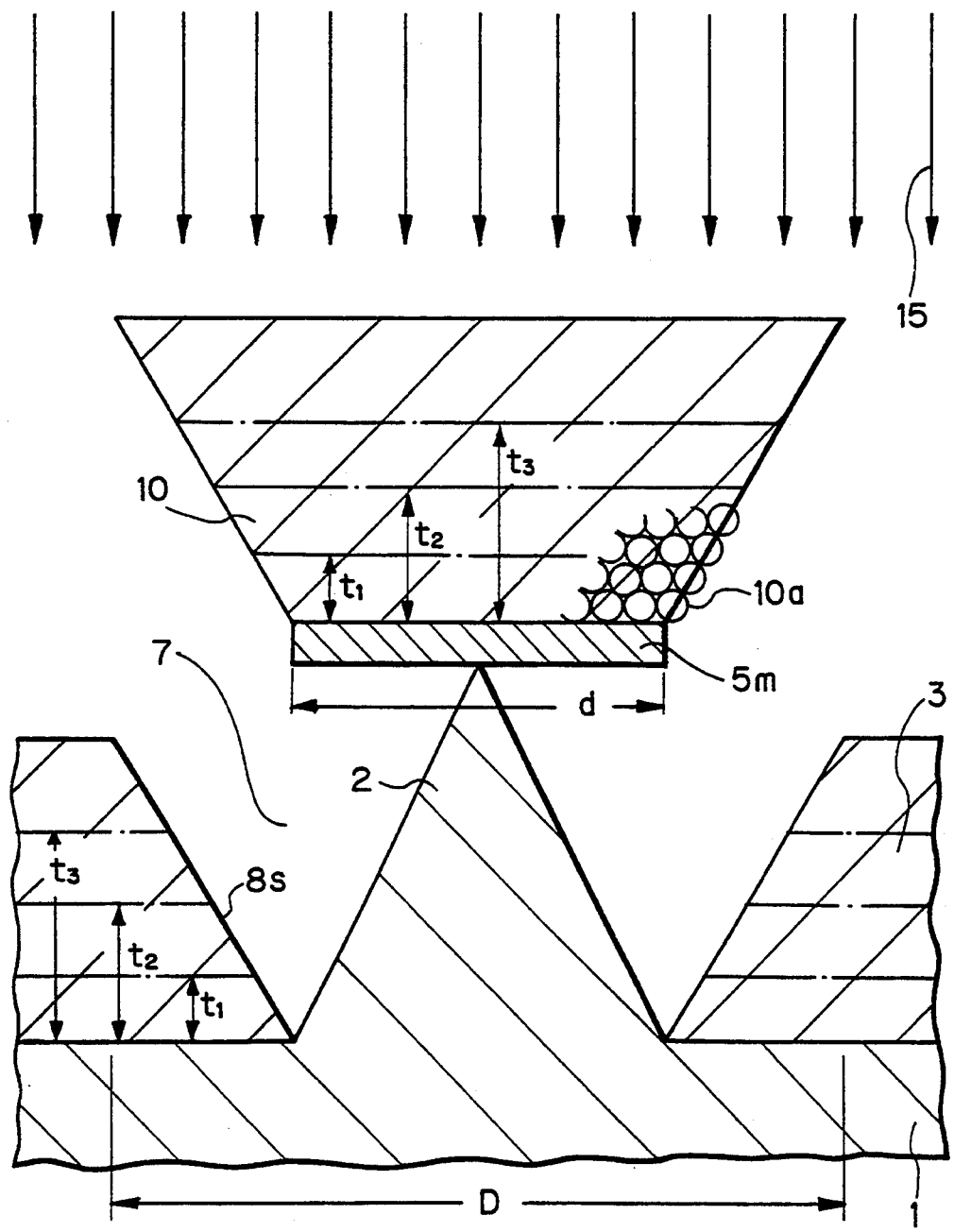
FIG. 7 is an enlarged sectional view showing the conventional patterning process shown in step (5) of FIG. 5.
Figure 8:
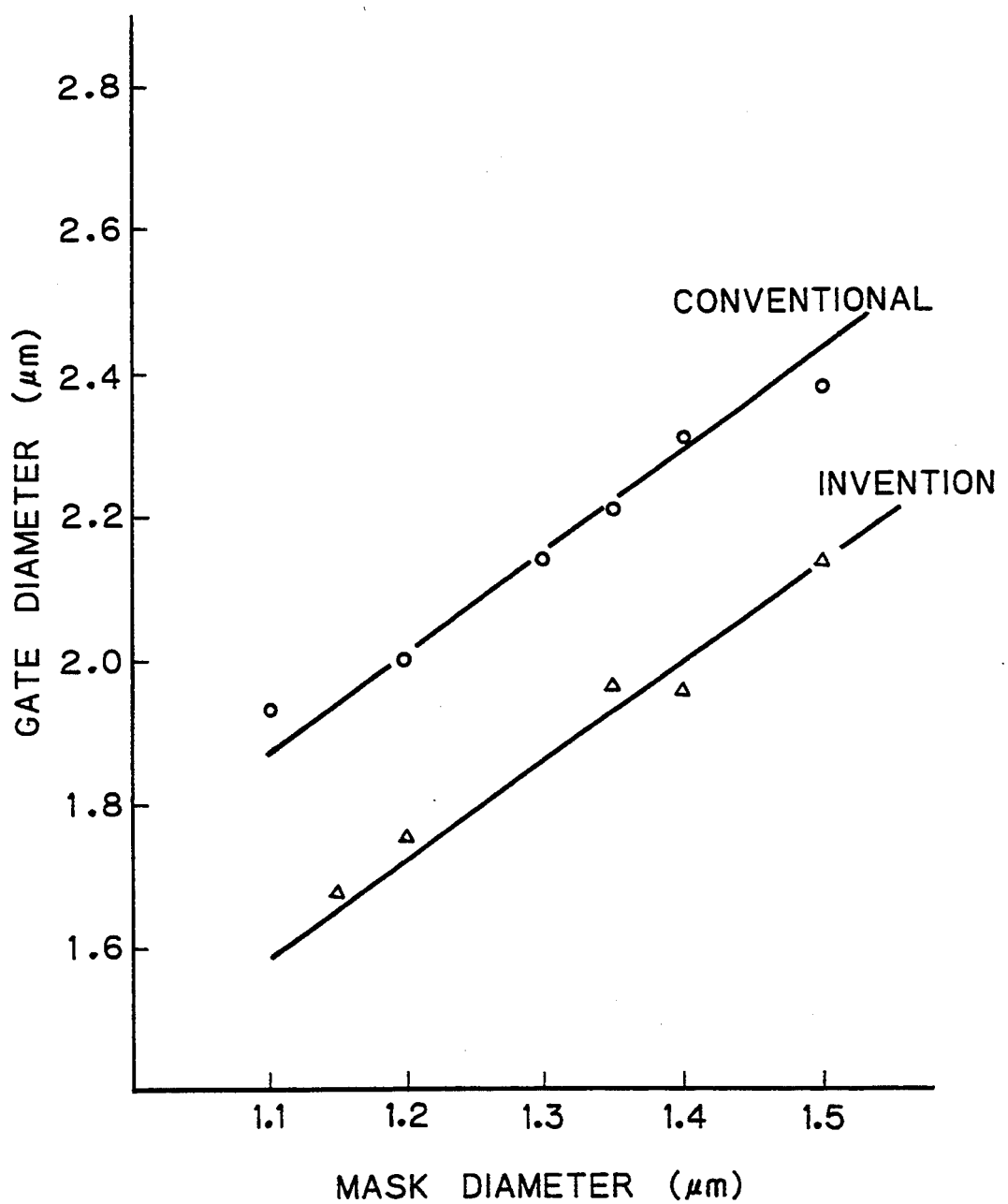
FIG. 8 is a graph showing the difference in gate diameter between micro field emission cathodes obtained according to the process of the present invention and according to the conventional process.

The gate diameter of a micro field emission cathode prepared according to the process of the present invention was measured on the basis of a microphotograph and compared with that of a micro field emission cathode prepared according to the conventional process. The obtained data are shown in FIG. 8. Where a SiO₂ insulating film was deposited with a thickness of 1 μm using a mask of a diameter of 1.1 to 1.5 μm without irradiating an ion beam as shown in FIG. 7, a gate diameter d of 1.8 to 2.4 μm was obtained. On the other hand, where a SiO₂ insulating film was deposited with a thickness of 1 μm using a mask of the same diameter by irradiating an ion beam as shown in FIG. 2, a gate diameter d of 1.6 to 2.2 μm was obtained. In both cases, an oxygen ion beam of 1 kV and 170 mA was applied and the deposition rate was 5 Å/min.

Figure 9:
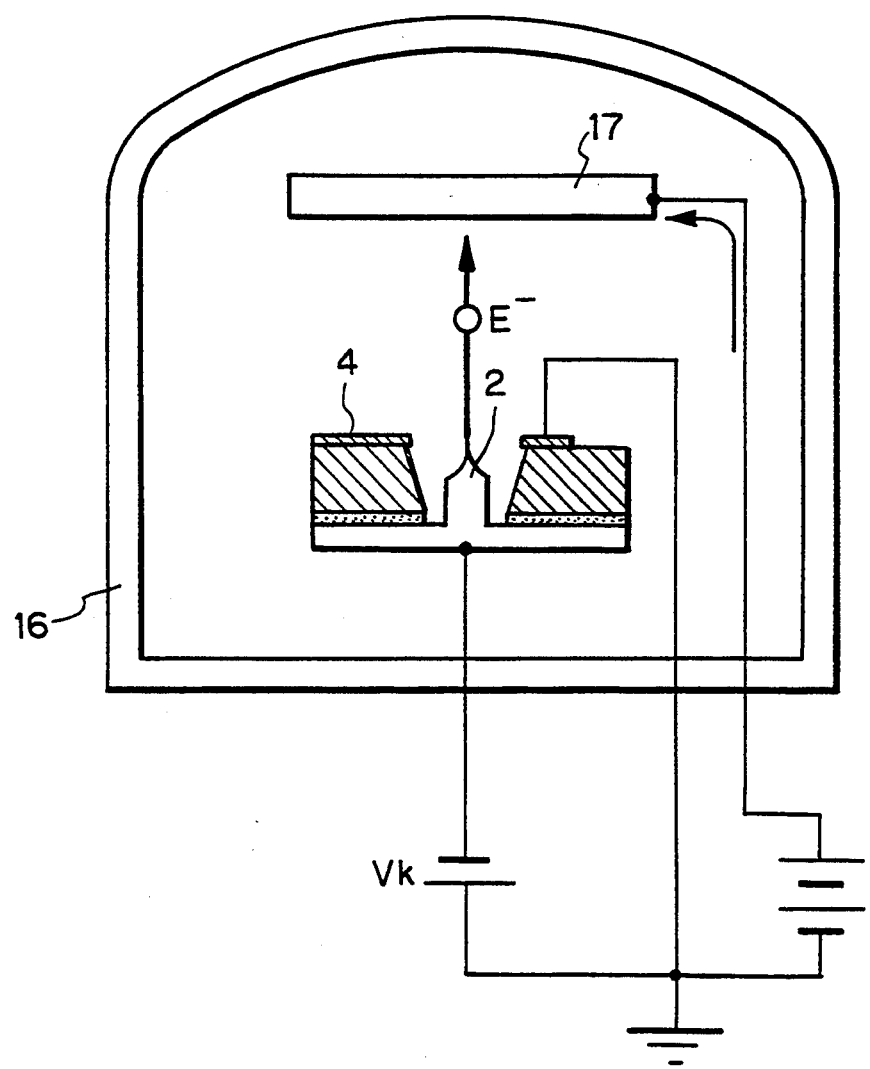
FIG. 9 is a sectional side view schematically illustrating an apparatus used for the measurement of the characteristics of micro field emission cathodes obtained by the conventional process and by the process according to the present invention.
Figure 10:
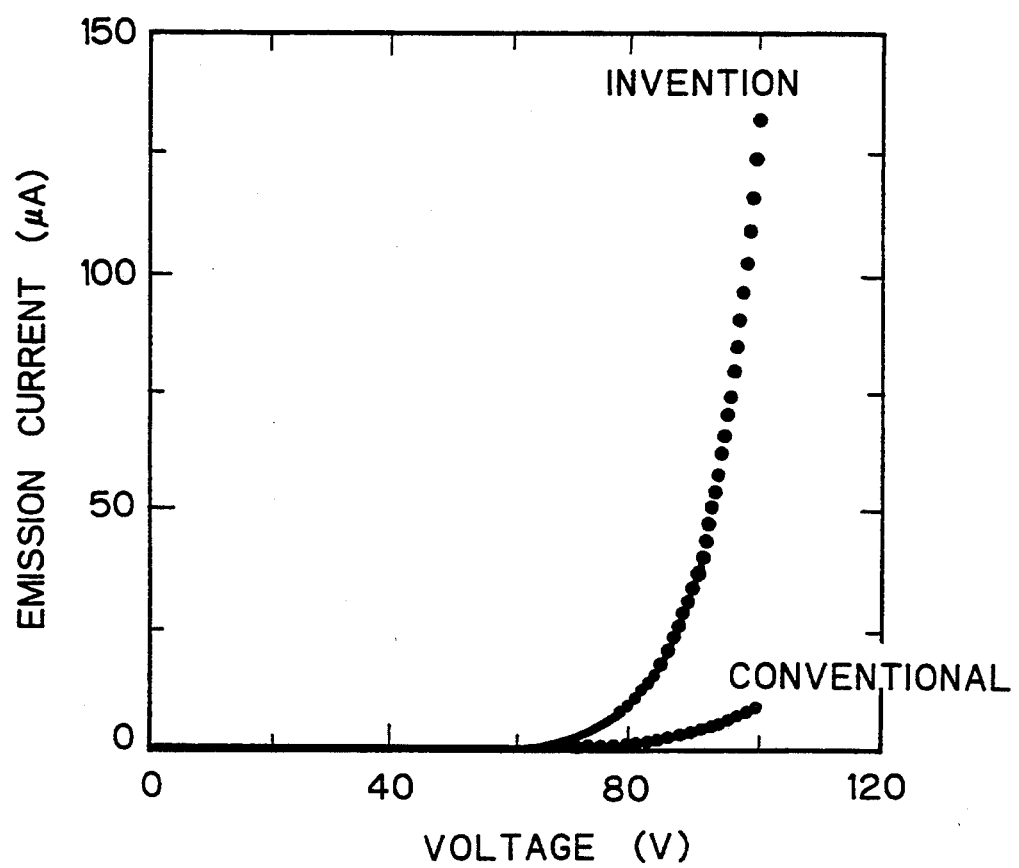
FIG. 10 is a graph showing the difference in characteristics between micro field emission cathodes obtained according to the process of the present invention and according to the conventional process.

The characteristics of a cathode having a gate diameter of 2.0 μm, which was obtained by the above-mentioned conventional process using a mask of a diameter of 1.2 μm and a cathode having a diameter of 1.7 μm obtained by the above-mentioned process according to the present invention using a mask of the same diameter were measured and compared. The measurement was carried out using an apparatus comprising a vacuum chamber 16 as shown in FIG. 9. A negative voltage Vk with respect to the gate electrode 4 was applied to the emitter tip 2 to apply a great electric field to the pointed tip of the emitter tip 2 and cause field emission to emit electrons into the vacuum. The emitted electrons were attracted by an anode plate 17 having a positive voltage and thus an emission current was measured. The results are shown in FIG. 10. From the data, it is proved that the same emission current can be obtained in the cathode obtained according to the present invention at a voltage lower by 20 V than in the cathode obtained by the conventional process.

Figure 11:
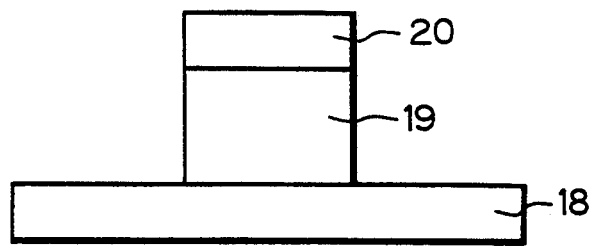
FIGS. 11(1)–(4) are sectional views showing stepwise a conventional process for forming a multi-layer circuit structure.
Figure 11:
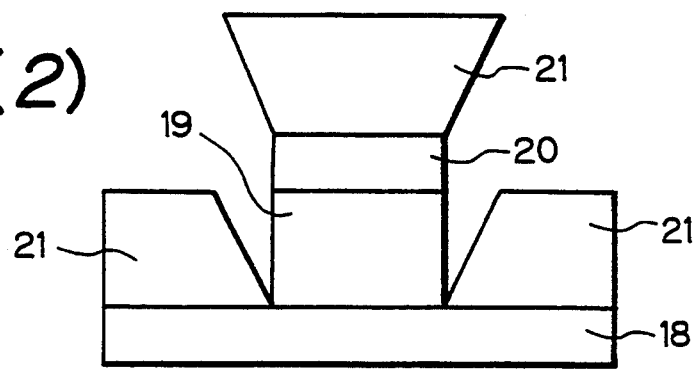
Figure 11:
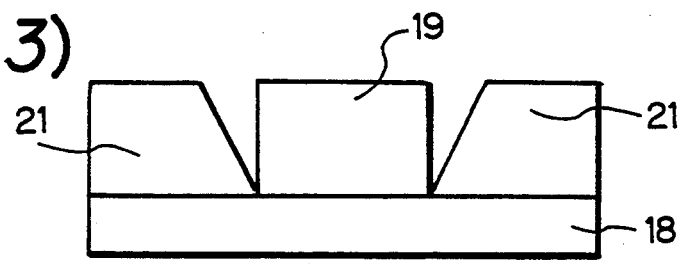
Figure 11:
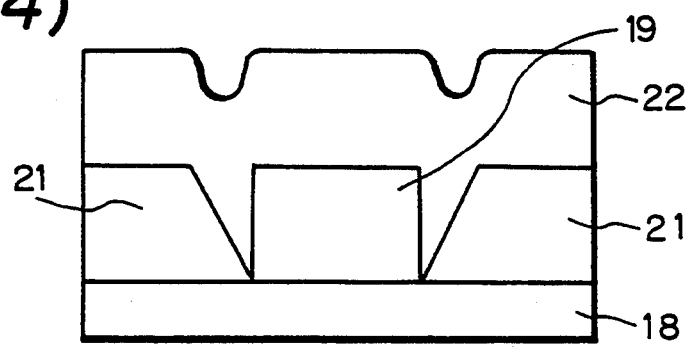

The process of the present invention can also be applied for the formation of a multi-layer circuit structure such as shown in FIG. 11. As shown at step (1) in FIG. 11, an aluminum electrode 19 was formed on a substrate 18 and a SiN mask 20 was formed on the aluminum electrode 19, for example. Then, at step (2), an insulating film 21 of SiO₂ was deposited by vacuum deposition. At this stage, the SiO₂ film 21 being deposited on the mask gradually expands transversely in the direction of the deposition, while the SiO₂ film 21 is deposited on the substrate so as to form grooves at both sides of the aluminum electrode 19. Therefore, after removing the SiN mask 20 by etching along with the SiO₂ film 21 at step (3), the grooves are left as such. Thus, a plane film cannot be obtained because of the presence of the grooves where an insulating film 22 is then deposited at the step (4). Contrary to this, as shown in FIG. 12, if an ion milling of the SiO₂ film deposited on the mask is carried out by irradiating an ion beam towards the mask according to the process of the present invention at step (2), grooves are not formed at the sides of the aluminum electrode 19 and a plane insulating film 22 can be obtained at step (4).

Though the description given above explains the embodiment wherein the present invention is applied to patterning by vacuum deposition, the present invention can provide similar effects when applied to other film-forming methods.

As described above, when patterning is carried out by forming the film from above the mask, the present invention irradiates an ion beam, such as an argon ion beam, to the mask, and carries out the film formation while milling and removing the outer periphery of the deposition material deposited on the mask. Therefore, the present invention can prevent, in advance, the expansion of the shade of the mask and the inclination of the end portion of the pattern due to the deposition of the deposition material on the mask, and can obtain a pattern profile having a vertical side surface. Accordingly, the present invention is particularly effective for forming a pattern having a large film thickness.

We claim:

1. A process for forming a pattern on a substrate comprising:

forming a mask on the substrate;

depositing a film-forming material on the mask and the substrate to form a film on the mask and on the substrate in regions not covered by the mask, the depositing of the film forming material on the mask being effected by a method which causes the lateral surface area of the film formed on the mask to increase during deposition, and irradiating an ion beam towards the mask so that deposition of the film forming material on the side surface portion of the film formed on the mask is inhibited during deposition by ion milling.

2. A process according to claim 1, wherein the irradiation of the ion beam is carried out by using an ion beam selected from an argon ion, an oxygen ion and a nitrogen ion.

3. A process according to claim 1, in which the film forming material is an insulating material and an insulating film of a micro field emission cathode is formed by the process.

4. A process according to claim 1, in which the film forming material is an insulating material and an insulating film of a multi-layer circuit structure is formed by the process.

5. A process for forming a micro field emission cathode comprising the steps of:

forming a mask on a substrate;

etching a region of the substrate not covered by the mask to form a projection under the mask;

forming an insulating film on the surface of the mask and the surface of the etched substrate not covered by the mask by deposition in a manner which causes the lateral surface area of the film formed on the mask to increase during deposition;

irradiating an ion beam towards the mask so that the deposition on the side surface portion of the insulating film being deposited on the mask is inhibited during deposition by ion milling;

forming a metal film on the insulating film deposited on the mask and the substrate;

removing the mask as well as the insulating film and the metal film thereon by etching; and, patterning the metal film on the substrate to form a gate electrode.

* * * * *

UNITED STATES PATENT AND TRADEMARK OFFICE
CERTIFICATE OF CORRECTION

PATENT NO. : 5,378,658
DATED : January 3, 1995
INVENTOR(S) : Osamu TOYODA et al.

It is certified that error appears in the above-indentified patent and that said Letters Patent is hereby corrected as shown below:

Column 2, line 8, delete "starting", and after "the" insert --starting--.

Signed and Sealed this

Fourteenth Day of March, 1995

Attest:

BRUCE LEHMAN

*Attesting Officer*  *Commissioner of Patents and Trademarks*